US010312343B2

(12) United States Patent
Miyazawa

(10) Patent No.: US 10,312,343 B2
(45) Date of Patent: Jun. 4, 2019

(54) DEVICE AND DEVICE MANUFACTURING METHOD

(71) Applicant: FUJI ELECTRIC CO., LTD., Kanagawa (JP)

(72) Inventor: Shigemi Miyazawa, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 184 days.

(21) Appl. No.: 15/220,348

(22) Filed: Jul. 26, 2016

(65) Prior Publication Data
US 2017/0077088 A1 Mar. 16, 2017

(30) Foreign Application Priority Data
Sep. 16, 2015 (JP) .................................. 2015-182851

(51) Int. Cl.
| H01L 29/866 | (2006.01) |
| H01L 29/66 | (2006.01) |
| H01L 29/739 | (2006.01) |
| H01L 27/06 | (2006.01) |
| H01L 27/07 | (2006.01) |

(52) U.S. Cl.
CPC .... *H01L 29/66106* (2013.01); *H01L 27/0629* (2013.01); *H01L 27/0727* (2013.01); *H01L 29/66333* (2013.01); *H01L 29/7395* (2013.01); *H01L 29/866* (2013.01)

(58) Field of Classification Search
CPC .................................................. H01L 29/7808
See application file for complete search history.

(56) References Cited

U.S. PATENT DOCUMENTS

| 5,973,359 A | 10/1999 | Kobayashi et al. |
| 6,385,028 B1 | 5/2002 | Kouno |
| 2014/0183627 A1* | 7/2014 | Ma .............. H01L 27/0296 257/334 |
| 2015/0048450 A1* | 2/2015 | Naito ............ H01L 29/402 257/337 |

FOREIGN PATENT DOCUMENTS

| JP | 2001094092 A | 4/2001 |
| JP | 2004-095694 A | 3/2004 |
| WO | 2014073656 A1 | 5/2014 |

OTHER PUBLICATIONS

Office Action issued for counterpart Japanese Application No. 2015-182851, issued by the Japan Patent Office on Apr. 9, 2019 (dated Apr. 2, 2019).

\* cited by examiner

*Primary Examiner* — Cheung Lee
*Assistant Examiner* — Scott Stowe

(57) ABSTRACT

A device includes a vertical semiconductor switch including (i) a gate terminal and a first terminal provided on a substrate and (ii) a second terminal provided on the substrate, where the vertical semiconductor switch is configured to electrically connect or disconnect the first terminal and the second terminal, a first insulative film provided on the substrate, a second insulative film provided on the substrate, where the second insulative film is in contact with the first insulative film and thinner than the first insulative film, and a zener diode formed on the first insulative film and the second insulative film, where the zener diode includes a first portion that is formed on the first insulative film and connected to the first surface of the substrate and a second portion that is formed on the second insulative film and connected to the gate terminal.

9 Claims, 13 Drawing Sheets

DEVICE AND DEVICE MANUFACTURING METHOD

The contents of the following Japanese patent application are incorporated herein by reference: NO. 2015-182851 filed on Sep. 16, 2015.

BACKGROUND

1. Technical Field

The present invention relates to a device and a device manufacturing method.

2. Related Art

In the conventional art, semiconductor devices designed, for example, to ignite internal combustion engines integrate therein a power semiconductor device, which is configured to handle high power, and an overvoltage protection circuit together (see, for example, Japanese Patent Application Publications No. 2000-77537, 11-145466 and 2004-95694).

Such a power semiconductor device has a zener diode between the collector and the gate in order to accommodate a high voltage to be input between the collector and the gate. However, integration of the power semiconductor device has made it difficult to form the zener diode in the power semiconductor device if the zener diode has a high breakdown voltage. If such a zener diode breaks down, a short-circuit is formed between the collector and the gate, which may cause a large current to continuously flow between the collector and the emitter. Consequently, the power semiconductor device is heated and may produce smoke and fire. In addition, the internal combustion engine having the semiconductor device installed therein may resultantly malfunction, cease to function or the like.

SUMMARY

Therefore, it is an object of an aspect of the innovations herein to provide a device and a device manufacturing method, which are capable of overcoming the above drawbacks accompanying the related art. The above and other objects can be achieved by combinations described in the claims. A first aspect of the innovations may include a device including a vertical semiconductor switch including (i) a gate terminal and a first terminal provided on a first surface of a substrate and (ii) a second terminal provided on a second surface of the substrate, where the vertical semiconductor switch is configured to electrically connect or disconnect the first terminal and the second terminal, a first insulative film provided on the first surface of the substrate, a second insulative film provided on the first surface of the substrate, where the second insulative film is in contact with the first insulative film and thinner than the first insulative film, and a zener diode formed on the first insulative film and the second insulative film, where the zener diode includes a first portion that is formed on the first insulative film and connected to the first surface of the substrate and a second portion that is formed on the second insulative film and connected to the gate terminal.

A second aspect of the innovations may include a device manufacturing method including forming a first insulative film on a first surface of a substrate, forming a second insulative film on the first surface of the substrate, where the second insulative film is thinner than the first insulative film and in contact with the first insulative film, forming a vertical semiconductor switch including (i) a gate terminal and a first terminal provided on the first surface of the substrate and (ii) a second terminal provided on a second surface of the substrate, where the vertical semiconductor switch is configured to electrically connect or disconnect the first terminal and the second terminal, forming a zener diode on the first insulative film and the second insulative film, where the zener diode includes a first portion provided on the first insulative film and connected to the first surface of the substrate and a second portion provided on the second insulative film and connected to the gate terminal.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

The embodiments do not limit the invention according to the claims, and all the combinations of the features described in the embodiments are not necessarily essential to means provided by aspects of the invention.

Figure 1:
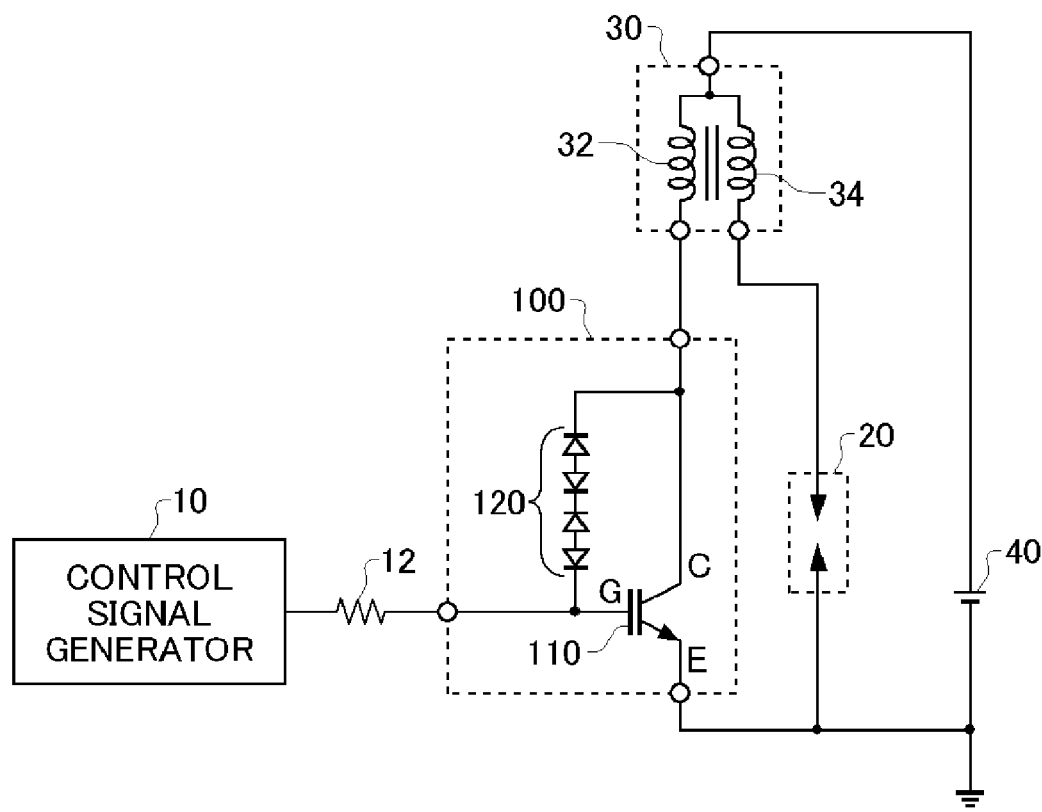
FIG. 1 shows an exemplary structure of an igniting device 1000 relating to an embodiment of the present invention.

FIG. 1 shows an exemplary structure of an igniting device 1000 relating to an embodiment of the present invention. The igniting device 1000 is configured to ignite an ignition plug for use with an internal combustion engine of an automobile, and the like. In the present embodiment, an exemplary case is described where the igniting device 1000 is installed in an automobile engine. The igniting device 1000 includes a control signal generator 10, a resistance 12, an ignition plug 20, an ignition coil 30, a power source 40 and a device 100.

The control signal generator 10 is designed to generate a switching control signal to switch on and off the device 100. The control signal generator 10 is, for example, part of or an engine control unit (ECU) of an automobile in which the igniting device 1000 is installed. The control signal generator 10 feeds the generated switching control signal to the device 100 via the resistance 12. In response to the control signal generator 10 feeding the switching control signal to the device 100, the igniting device 1000 starts igniting the ignition plug 20.

The ignition plug 20 discharges to generate electric sparks. The ignition plug 20 discharges when applied with a voltage of approximately 10 kV or higher, for example. The ignition plug 20 is, for example, installed within an internal combustion engine. In this case, the ignition plug 20 ignites a combustible gas such as a gas mixture within a combustion chamber. The ignition plug 20 is, for example, disposed in a through hole connecting together the outside of the cylinder and the combustion chamber within the cylinder and secured in a manner to seal the through hole. One of the ends of the ignition plug 20 is exposed within the combustion chamber and the other receives an electrical signal from the outside of the cylinder.

The ignition coil 30 feeds the electrical signal to the ignition plug 20. The ignition coil 30 feeds, as the electrical signal, a high voltage sufficient to cause the ignition plug 20 to discharge. The ignition coil 30 may function as a transformer, and may be an ignition coil including a primary coil 32 and a secondary coil 34, for example. One of the ends of the primary coil 32 is electrically connected to one of the ends of the secondary coil 34. The primary coil 32 has a smaller number of windings than the secondary coil 34 and shares the core with the secondary coil 34. The secondary coil 34 generates electromotive force (electromotive force generated by mutual induction) according to the electromotive force generated in the primary coil 32. The other end of the secondary coil 34 is connected to the ignition plug 20, so that the generated electromotive force is fed to the ignition plug 20 to cause the ignition plug 20 to discharge.

The power source 40 feeds a voltage to the ignition coil 30. For example, the power source 40 feeds a predetermined constant voltage Vb (for example, 14 V) to one of the ends of the primary coil 32 and one of the ends of the secondary coil 34. The power source 40 is, for example, a battery of an automobile.

The device 100 allows or stops the current flow between the other end of the primary coil 32 of the ignition coil 30 and the reference potential, in response to the switching control signal fed from the control signal generator 10. For example, the device 100 allows the current flow between the primary coil 32 and the reference potential when the switching control signal has a HIGH voltage (on voltage) and stops the current flow between the primary coil 32 and the reference potential when the switching control signal has a LOW voltage (off voltage). Here, the reference potential may be the reference potential in the control system of the automobile, or the reference potential for the device 100 in the automobile. The reference potential may be equal to the LOW voltage that is designed to turn off the device 100, for example, 0 V. The device 100 includes a vertical semiconductor switch 110 and a zener diode 120.

The vertical semiconductor switch 110 has a gate terminal (G), a first terminal and a second terminal. The first and second terminals are electrically connected to each other or disconnected from each other in response to the switching control signal input to be into the gate terminal. For example, the vertical semiconductor switch 110 is an insulated gate bipolar transistor (IGBT). Alternatively, the vertical semiconductor switch 110 may be a MOS transistor. If the vertical semiconductor switch 110 is one of such transistors, the first terminal is an emitter terminal (E) and connected to the reference potential. In addition, the second terminal is a collector terminal (C) and connected to the other end of the primary coil 32. In the present exemplary embodiment, the description is made in relation to the exemplary case where the vertical semiconductor switch 110 is an insulated gate bipolar transistor.

The zener diode 120 is disposed between the second terminal of the vertical semiconductor switch 110 and the gate terminal of the vertical semiconductor switch 110. The zener diode 120 prevents the high voltage input through the second terminal from being input into the gate terminal. The zener diode 120 desirably exhibits a breakdown voltage of approximately several hundred voltages.

In the device 100 in accordance with the above-described present embodiment, the vertical semiconductor switch 110 is turned on when the switching control signal has the HIGH voltage. As a result, a collector current Ic flows from the power source 40 through the primary coil 32 of the ignition coil 30. Here, the temporal change rate dIc/dt of the collector current Ic is determined by the inductance of the primary coil 32 and the voltage fed from the power source 40, and the collector current Ic increases until it reaches a predetermined (or designated) current value. For example, the collector current Ic increases until it reaches approximately several amperes, dozen amperes or several dozen amperes.

Subsequently, once the switching control signal transitions to the LOW voltage, the vertical semiconductor switch 110 is turned off and the collector current dramatically decreases. The dramatic decrease in the collector current drastically increases the voltage across the primary coil 32 due to the electromotive force generated by self induction, which generates induction and resultantly electromotive force of up to approximately several dozen kilovolts across the secondary coil 34. In the igniting device 1000, the voltage across the secondary coil 34 is fed to the ignition plug 20 in order to cause the ignition plug 20 to discharge to ignite the combustible gas.

Here, if the voltage across the primary coil 32 increase to the level approximately equal to the breakdown voltage of the zener diode 120 (for example, 400 V), a current gradually starts to flow from the collector terminal to the gate terminal. Here, the current flowing from the collector terminal to the gate terminal and the resistance 12 determine the gate voltage of the vertical semiconductor switch 110. Thus, as the voltage across the primary coil 32 increases, the gate voltage of the vertical semiconductor switch 110 increases. Once the gate voltage reaches the level approximately equal to the threshold Vth of the vertical semiconductor switch 110 (for example, 2 V), the impedance at the collector of the vertical semiconductor switch 110 decreases. In this way, in the vertical semiconductor switch 110, the voltage between the collector terminal and the emitter terminal is regulated to be substantially equal to the total of the threshold Vth and the breakdown voltage of the zener diode 120 (the voltage between the collector terminal and the emitter terminal is clamped).

As described above, the igniting device 1000 relating to the present embodiment can ignite the ignition plug 20 in response to the switching control signal. The device 100 uses the zener diode 120 to clamp the voltage between the collector terminal and the emitter terminal in the vertical semiconductor switch 110, so that the vertical semiconductor switch 110 is prevented from breaking down. The device 100 is described in the following.

Figure 2:
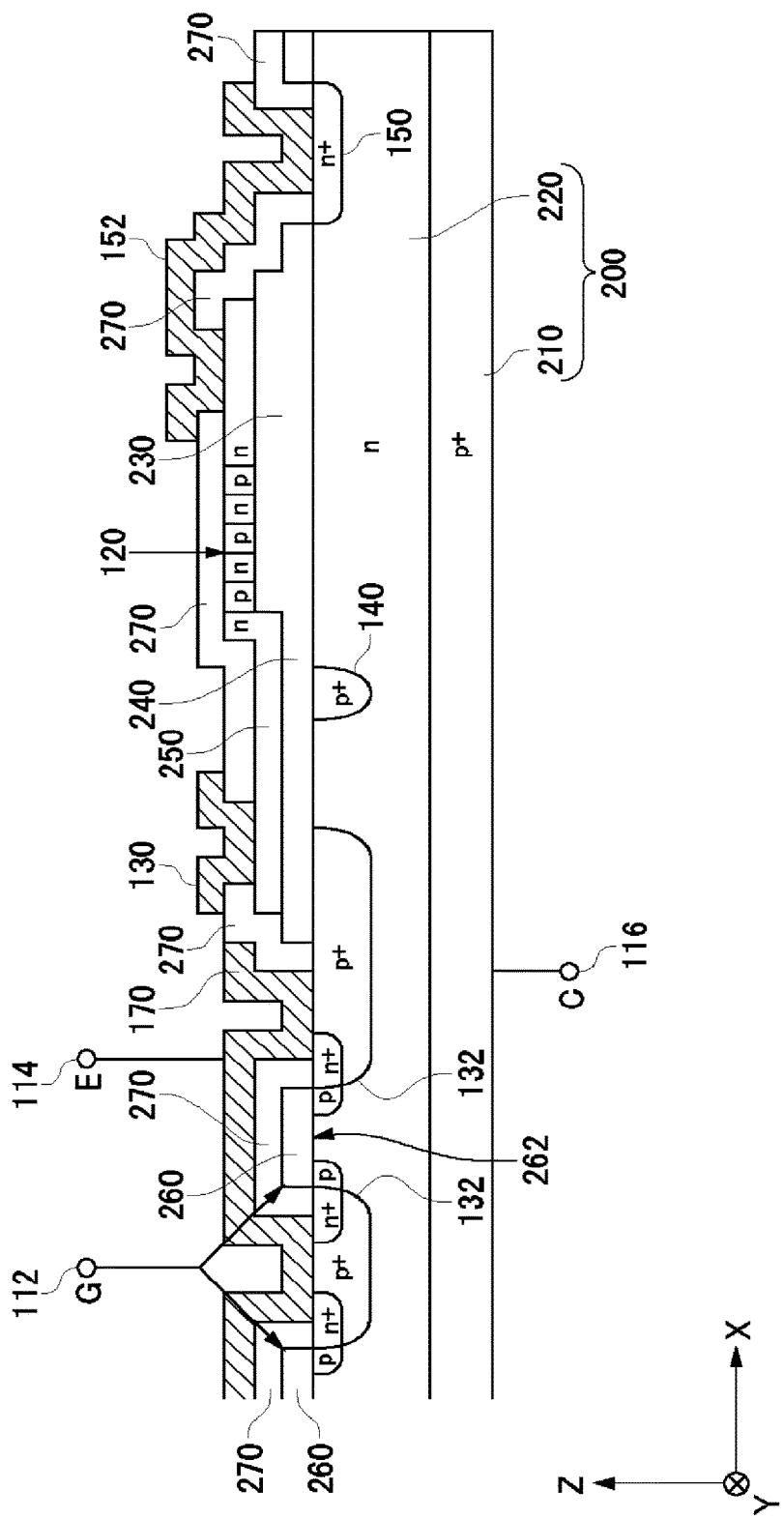
FIG. 2 shows an exemplary cross-section of a device 100 relating to an embodiment of the present invention.

FIG. 2 shows an exemplary cross-section of the device 100 relating to the present embodiment. The components of the device 100 shown in FIG. 2 will be described in detail later, and the following description mainly focuses on some of the components corresponding to the components of the device 100 that have been described with reference to FIG. 1. The device 100 has the gate terminal 112 and the first terminal 114 (i.e., the emitter terminal) on a first surface of a substrate 200 and the second terminal 116 (i.e., the collector terminal) on a second surface that faces away from the first surface. In the device 100, the electrical connection between the first terminal 114 and the second terminal 116 in the vertical direction (the Z direction) is established or cut off in response to the control signal input into the gate terminal 112.

The device 100 is formed using the substrate 200. The substrate 200 has a $p^+$-type layer region 210 and an n-type layer region 220 that is provided on a first surface of the $p^+$-type layer region 210. The substrate 200 is a silicon substrate, for example. As for the substrate 200, the n-type layer region 220 is formed by implanting impurities such as phosphorous or arsenic into a first surface of a p-type substrate doped with boron or the like, for example. FIG. 2 shows an example where the first surface of the substrate 200 indicates the surface that faces the +Z direction and the first surface is defined as substantially parallel to the XY plane. FIG. 2 shows an exemplary structure of the cross-section of the device 100 along the XZ plane, which is substantially perpendicular to the first surface. The second terminal 116 is formed on the p+-type layer region 210 of the substrate 200. Here, a collector electrode may be further formed on the second surface of the substrate 200.

The n-type layer region 220 has a first well region 132, a second well region 140 and a third well region 150 formed therein. In the first well region 132, the emitter region of the vertical semiconductor switch 110 is formed. The n-type layer region 220 has a plurality of first well regions 132 formed therein. The first well region 132 is formed as a $p^+$-type region, for example, and the emitter region, which is an $n^+$-type region, is formed in the $p^+$-type region. The first well region 132, as well as the emitter region, is connected to the first terminal 114. Adjacent to the first well region 132, a p-type region having a lower impurity concentration than the first well region 132 may be formed, for example.

The second well region 140 is positioned closer to the edge of the substrate 200 than the first well region 132 is and electrically insulated from the first well region 132. The second well region 140 is formed as a $p^+$-type region, for example. The second well region 140 forms p-n junction with the n-type layer region 220, which surrounds the second well region 140, and resultantly forms a depletion layer. In this way, the second well region 140 prevents the carriers generated by the high voltage applied to the substrate 200 or the like from flowing toward the first well region 132. The third well region 150 is formed at the periphery of the substrate 200 and electrically connected to the second terminal 116.

On the first surface of the n-type layer region 220, a runner electrode 130, a first insulative film 230, a second insulative film 240, a semiconductor film 250 and a gate electrode 260 are stacked. The runner electrode 130 is connected to the gate terminal 112 and the gate electrode 260. The gate electrode 260 is formed between two first well regions 132 that are arranged adjacent to each other in the X direction. The gate electrode 260 is connected to the gate terminal 112. Between the gate electrode 260 and the n-type layer region 220, a gate insulator 262 is formed.

The first insulative film 230 and the second insulative film 240 are formed on the first surface of the n-type layer region 220. The first insulative film 230 and the second insulative film 240 include, for example, an oxide film. The first insulative film 230 and the second insulative film 240 contain, for example, silicon oxide. The second insulative film 240 is in contact with the first insulative film 230 and thinner than the first insulative film 230.

The semiconductor film 250 is formed on the upper surface of the first insulative film 230 and the second insulative film 240, and connected at one end thereof to the runner electrode 130 and at the other end thereof to the third well region 150. The semiconductor film 250 is, for example, made of polysilicon. A first portion of the semiconductor film 250 that is positioned on the first insulative film 230 has the zener diode 120 formed therein. In other words, the zener diode 120 is formed between the gate terminal 112 and the second terminal 116.

When a sharply rising high voltage that is positive relative to the collector potential (a positive surge) is applied between the first terminal 114 and the second terminal 116, the device 100 relating to the above-described present embodiment operates to clamp the voltage between the first terminal 114 and the second terminal 116 as described with reference to FIG. 1. However, while such a positive surge sharply rises within a rising time of less than approximately several microseconds, the clamp procedure by the zener diode 120 starts after a delay time of approximately several microseconds. Stated differently, the collector potential continues rising during the delay time and may exceed, for example, the breakdown voltage of the p-n junction between a portion of the n-type layer region 220 that is close to the collector and the first well region 132, which is connected to the emitter, (for example, 600 V).

To address this issue, the second well region 140 forms a p-n junction region that exhibits a breakdown voltage higher than the breakdown voltage of the n-type layer region 220 and the first well region 132. In this way, the device 100 can prevent currents from flowing between the collector and the emitter in the region extending from the second well region 140 to the gate electrode 260. In this case, however, a potential distribution in which the potential increases from around the second well region 140 toward the third well region 150 is formed within the n-type layer region 220. If the difference in potential between the n-type layer region 220 and the semiconductor film 250 exceeds the breakdown voltage exhibited by the materials of the first and second insulative films 230 and 240 (for example, the oxide film has a breakdown voltage of 800 V or the like), breakdown may occur.

To be specific, the sharply rising positive surge may cause the insulative films to experience dielectric breakdown within the region extending from the second well region 140 to the third well region 150. If such is the case, the breakdown often occurs in the vicinity of the boundary between the first insulative film 230 and the second insulative film 240. Here, the first insulative film 230 is formed on the region extending from the second well region 140 to the third well region 150 and has a larger area than the second well region 140 in order to flatten the potential distribution formed in this region. In addition, the first insulative film 230 can have a larger thickness than the second insulative film 240 (will be described later) and thus can have a higher breakdown voltage than the second insulative film 240. Accordingly, the zener diode 120 is formed in the first portion of the semiconductor film 250 that is positioned on the first insulative film 230.

If the breakdown occurs in the vicinity of the boundary between the first insulative film 230 and the second insulative film 240, the collector voltage is directly fed to the runner electrode 130 and the current flows from the second terminal 116 directly into the gate terminal 112. Once the gate voltage exceeds the threshold Vth of the vertical semiconductor switch 110, the vertical semiconductor switch 110 can no longer cut off the electrical connection between the first terminal 114 and the second terminal 116. If the vertical semiconductor switch 110 continuously allows the current to flow therethrough as described above, the ignition coil 30 and the igniting device 1000 are heated, as a result of which the ignition coil 30 and the igniting device 1000 produce smoke and fire, and/or cease to function due to the melted fuse or the like. This may affect the driving of the automobile in which the igniting device 1000 is installed.

To solve this problem, a device 300 relating to the present embodiment is configured such that part of the zener diode 120 is also formed on the second insulative film 240. In this way, even if the insulative films break down, the other devices and elements are prevented from failing. Such a device 300 is described in the following. The device 300 relating to the present embodiment includes the gate terminal 112, the first terminal 114, and the second terminal 116 and establishes or cuts off the electrical connection between the first terminal 114 and the second terminal 116 in response to the switching control signal input into the gate terminal 112, like the device 100 described with reference to FIG. 1.

In other words, how to ignite the igniting device 1000 using the device 300 is substantially the same as how to ignite the igniting device 1000 using the device 100 and not described here. The components and/or operations of the device 300 relating to the present embodiment are assigned with the same reference numerals if they are substantially the same as the corresponding components and/or operations of the device 100 relating to the embodiment shown in FIG. 2 and not described again.

Figure 3:
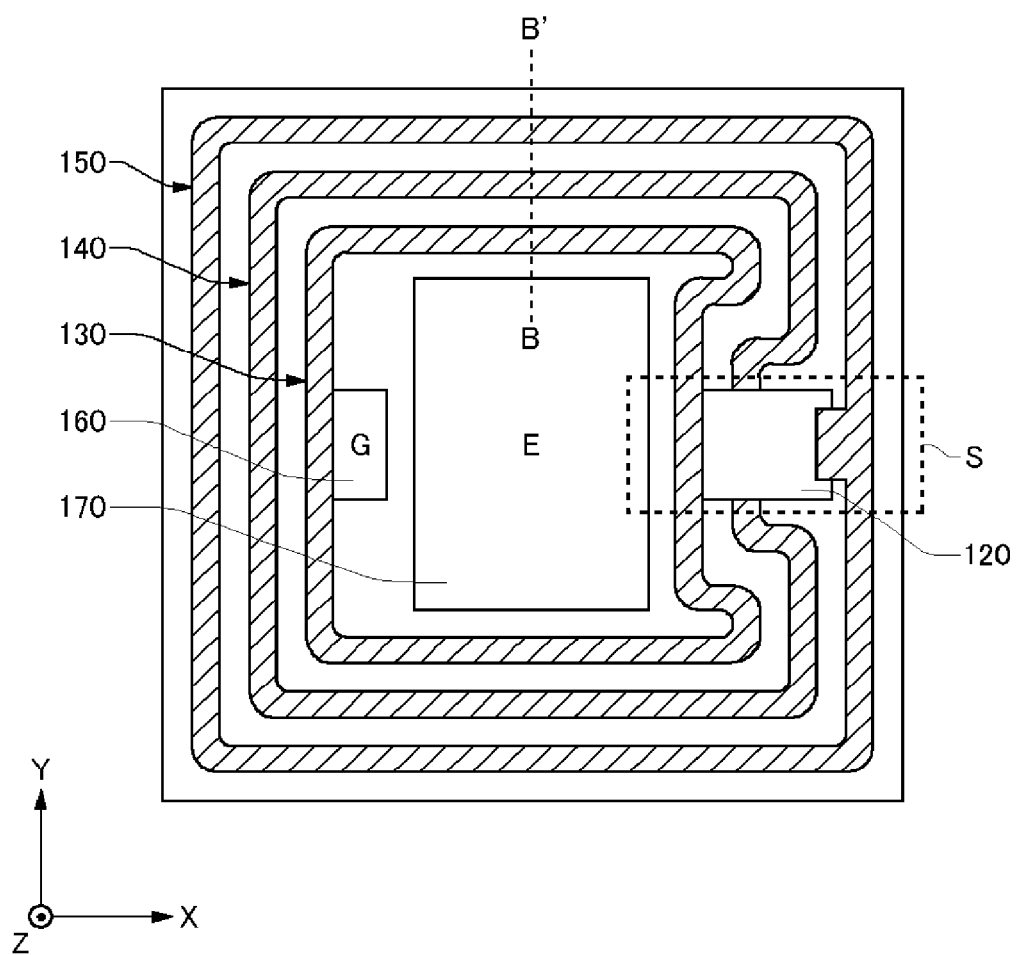
FIG. 3 shows an exemplary structure of a first surface of a device 300 relating to an embodiment of the present embodiment, on which a gate electrode and an emitter electrode are formed.

FIG. 3 shows an exemplary structure of the first surface of the device 300, on which the gate electrode and the emitter electrode are formed. The first surface shown in FIG. 3 is substantially parallel to the XY plane. FIG. 3 shows the zener diode 120, the runner electrode 130, the second well region 140, the third well region 150, a gate pad 160, an emitter electrode 170 provided in the device 300.

The zener diode 120 is formed in at least a portion of the semiconductor film 250, which electrically connects together the runner electrode 130 and the third well region 150 as described with reference to FIG. 2. The zener diode 120 will be described later.

The runner electrode 130 is connected to the gate terminal 112 and exhibits a voltage equal to the gate voltage. The runner electrode 130 is insulated from the emitter electrode 170 and formed so as to surround the emitter electrode 170. Surrounding the emitter electrode 170 in this way, the runner electrode 130 reduces the noise that may have a voltage value approximately equal to or lower than the gate voltage and may be input into the emitter electrode 170 enclosed within the runner electrode 130.

The second well region 140 is insulated from the runner electrode 130 and formed so as to surround the runner electrode 130. Surrounding the runner electrode 130 in this way, the second well region 140 reduces the noise that may have a voltage value approximately equal to or lower than the breakdown voltage of the p-n junction formed by the second well region 140 and may be input into the runner electrode 130 and the emitter electrode 170 enclosed within the second well region 140. The second well region 140 functions as a guard ring designed to protect the runner electrode 130 and the emitter electrode 170 against a voltage signal input from outside or the like. Stated differently, the region surrounded by the second well region 140 is defined as an edge termination region of the device 300.

The third well region 150 is insulated from the second well region 140 and surrounds the second well region 140. The third well region 150 is provided at the periphery of the device 300 and isolates the elements from outside. The third well region 150 is electrically connected to the second terminal 116. In addition, the third well region 150 is connected to the zener diode 120.

The gate pad 160 is an electrode pad connected to the runner electrode 130. The gate pad 160 is, for example, the gate terminal 112. When the device 300 is housed within a package or the like, the gate pad 160 is electrically connected by means of the wire bonding technique or the like with the terminal provided in the package. The gate pad 160 and the runner electrode 130 may be integrally formed or the gate pad 160 may be part of the runner electrode 130.

The emitter electrode 170 is an electrode in contact with the first well region 132. For example, when a plurality of first well regions 132 are formed in the device 300, the emitter electrode 170 is in contact with the plurality of first well regions 132. At least part of the emitter electrode 170 is, for example, the first terminal 114. At least part of the emitter electrode 170 may be an electrode pad. When the device 300 is housed within a package or the like, at least part of the emitter electrode 170 is electrically connected by means of the wire bonding technique or the like with the terminal provided in the package.

Figure 4:
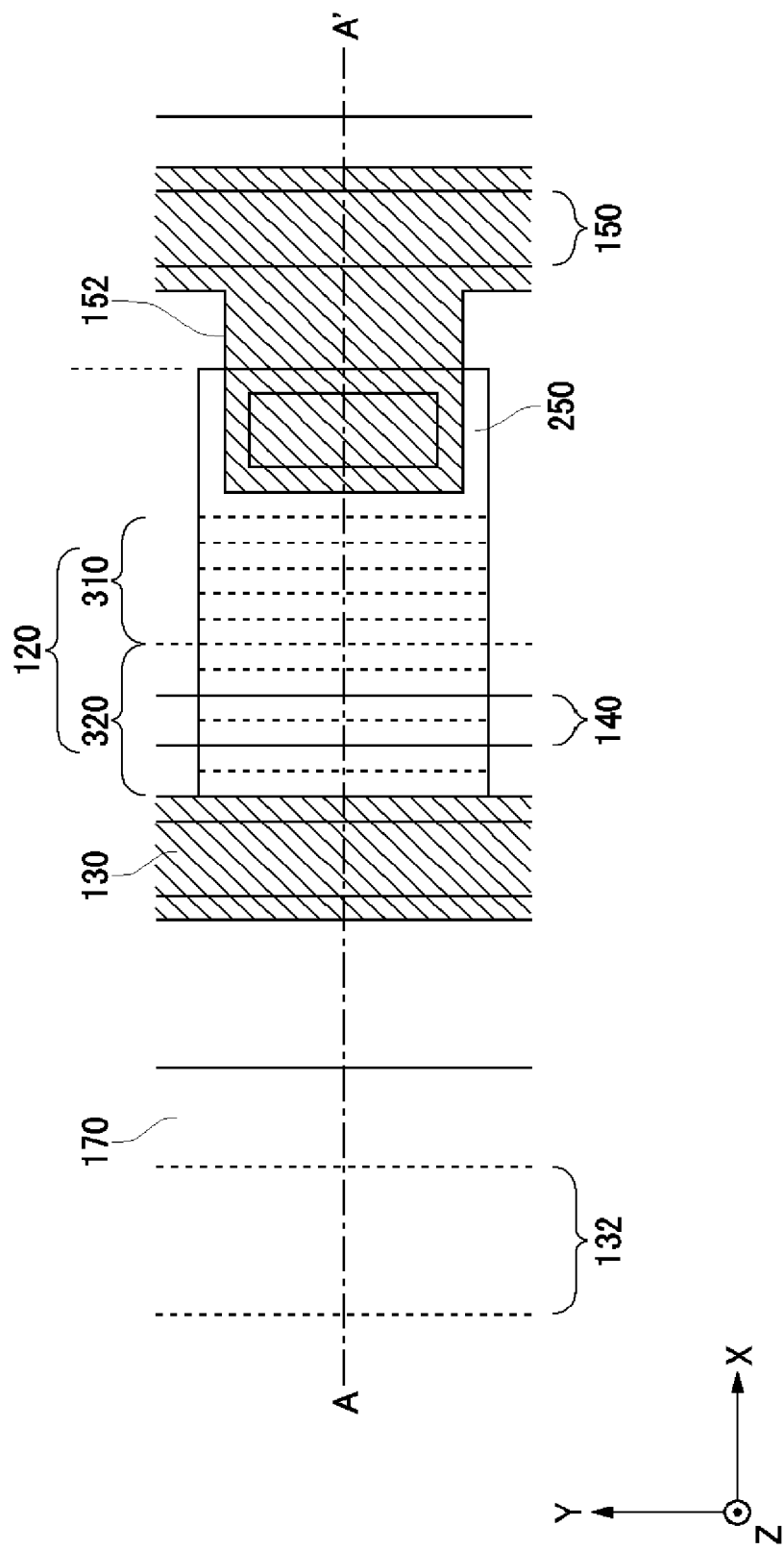
FIG. 4 is an enlarged view showing an exemplary structure of a region S of the device 300 of FIG. 3.

FIG. 4 is an enlarged view showing an exemplary structure of a region S of the device 300 of FIG. 3. In FIG. 4, the runner electrode 130, the first well region 132, the second well region 140 and the third well region 150 extend in substantially the same direction (in the present exemplary embodiment, the Y-axis direction). The first well region 132 is positioned so as to be covered with the emitter electrode 170, for example. The third well region 150 has an electrode unit 152 formed therein, and the electrode unit 152 electrically connects the third well region 150 to the semiconductor film 250.

The semiconductor film 250 extends in the direction substantially perpendicular to the direction in which the runner electrode 130 and the third well region 150 extend (in the present exemplary embodiment, the X-axis direction), and the zener diode 120 is formed in a portion of the semiconductor film 250. The zener diode 120 is divided into a first portion 310 and a second portion 320. The device 300 including the above-described zener diode 120 will be described with reference to FIG. 5, which shows the cross-section along A-A' in FIG. 4.

Figure 5:
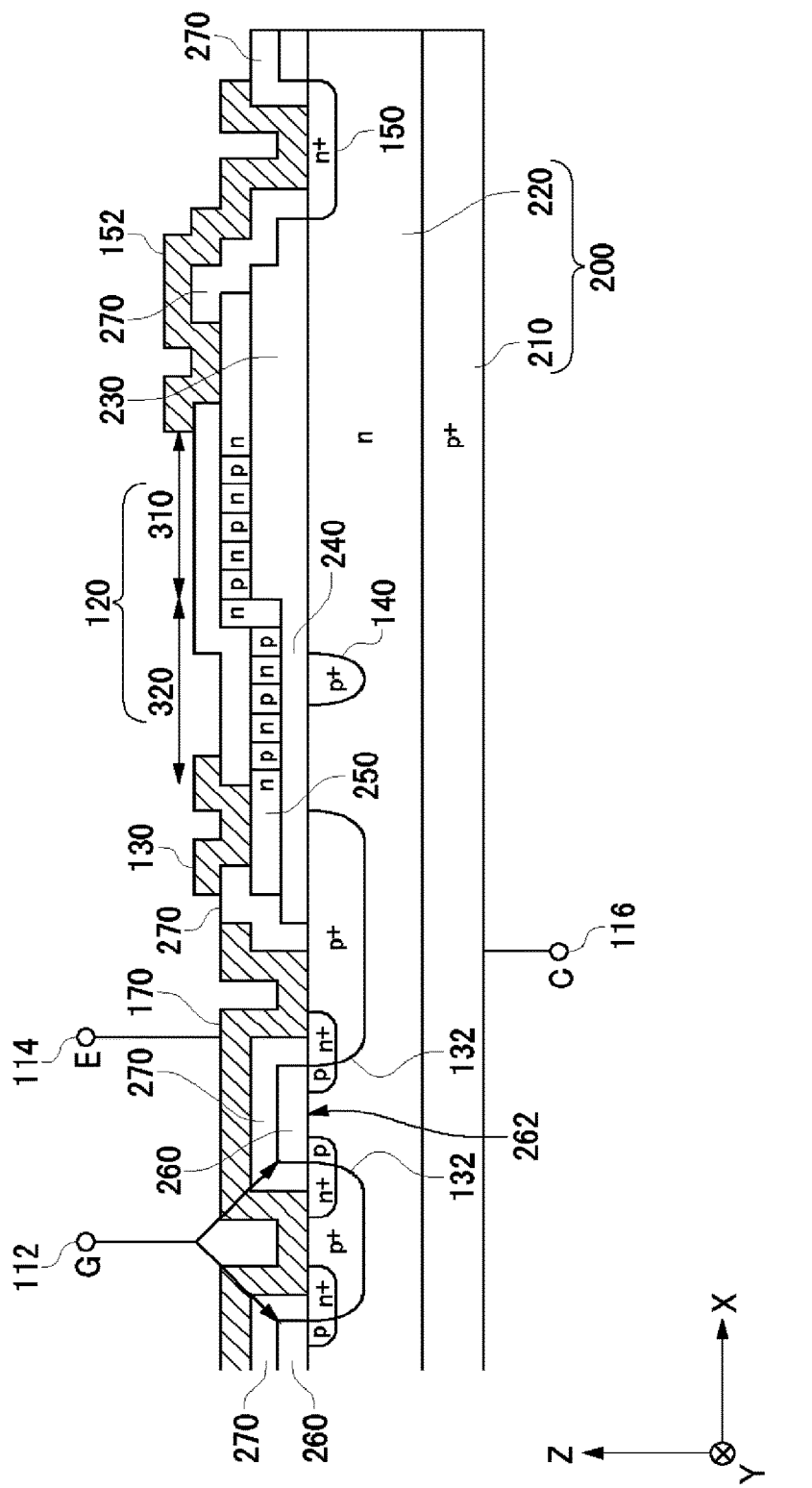
FIG. 5 shows a first example of the cross-section of the device 300 relating to the embodiment of the present invention.

FIG. 5 shows a first example of the cross-section of the device 300 relating to the embodiment of the present invention. The device 300 has the gate terminal 112 and the first terminal 114 (i.e., the emitter terminal) on the first surface of the substrate 200 and the second terminal 116 (i.e., the collector terminal) on the second surface that faces away from the first surface. In other words, the device 300 includes the vertical semiconductor switch 110 that establishes or cut off the electrical connection between the first terminal 114 and the second terminal 116 in the vertical direction (the Z direction) in response to the control signal input into the gate terminal 112. For example, the vertical semiconductor switch 110 is an insulated gate bipolar transistor (IGBT).

The device 300 is formed using the substrate 200. The substrate 200 has the $p^+$-type layer region 210 and the n-type layer region 220 that is provided on the first surface of the $p^+$-type layer region 210. The substrate 200 is a silicon substrate, for example. As for the substrate 200, the n-type layer region 220 is formed by implanting impurities such as phosphorous or arsenic into a first surface of a p-type substrate doped with boron or the like, for example. FIG. 5 shows an example where the first surface of the substrate 200 indicates the surface that faces the +Z direction and is defined as substantially parallel to the XY plane. FIG. 5 shows an exemplary structure of the cross-section of the device 300 along the XZ plane, which is substantially perpendicular to the first surface. The second terminal 116 is formed on the $p^+$-type layer region 210 of the substrate 200. Here, a collector electrode may be further formed on the second surface of the substrate 200.

The n-type layer region 220 has the first well region 132, the second well region 140 and the third well region 150 formed therein. In the first well region 132, the emitter region of the vertical semiconductor switch 110 is formed. The n-type layer region 220 has a plurality of first well regions 132 formed therein. The first well region 132 is formed as the $p^+$-type region, for example, and the emitter region, which is the $n^+$-type region, is formed in the $p^+$-type region. The first well region 132, as well as the emitter region, is connected to the first terminal 114. Adjacent to the first well region 132, a p-type region having a lower impurity concentration than the first well region 132 may be formed, for example.

The second well region 140 is positioned below the second insulative film 240 on the first surface side of the substrate 200. The second well region 140 is positioned closer to the edge of the substrate 200 than the first well region 132 is and electrically insulated from the first well region 132. The second well region 140 is, for example, formed as a $p^+$-type region. The second well region 140 forms p-n junction with the n-type layer region 220, which surrounds the second well region 140, and resultantly forms a depletion layer. In this way, the second well region 140 prevents noise of a high voltage applied to the substrate 200 or the like from propagating to the first well region 132. The third well region 150 is formed at the periphery of the substrate 200 and connected to the second terminal 116.

On the first surface of the n-type layer region 220, the runner electrode 130, the electrode unit 152, the emitter electrode 170, the first insulative film 230, the second insulative film 240, the semiconductor film 250, a gate electrode 260 and a third insulative film 270 are stacked. The runner electrode 130 is connected to the gate terminal 112 and the gate electrode 260. The gate electrode 260 is formed between two first well regions 132 that are arranged adjacent to each other in the X direction. The gate electrode 260 is connected to the gate terminal 112. Between the gate electrode 260 and the n-type layer region 220, the gate insulator 262 is formed. The emitter electrode 170 is in contact with the first well region 132. The emitter electrode 170 is formed above the gate electrode 260.

The runner electrode 130, the electrode unit 152 and the emitter electrode 170 are, for example, stacked on the first surface of the substrate 200 after the third insulative film 270 is formed. The third insulative film 270 electrically insulates the runner electrode 130, the electrode unit 152 and the emitter electrode 170 from each other. The third insulative film 270 is, for example, made of boron phosphorous silica glass (BPSG).

The first insulative film 230 is formed on the first surface of the substrate 200. The first insulative film 230 is, for example, a natural oxide film, which is formed by oxidation. The second insulative film 240 is in contact with the first insulative film 230 on the first surface of the substrate 200. The second insulative film 240 is thinner than the first insulative film 230. The second insulative film 240 is formed in a selected region of the first surface of the substrate 200. The first insulative film 230 and the second insulative film 240 surround the emitter electrode 170 on the first surface of the substrate 200, for example. The first insulative film 230 and the second insulative film 240 include an oxide film, for example. The first insulative film 230 and the second insulative film 240 contain silicon oxide, for example.

The semiconductor film 250 is formed on the upper surface of the first insulative film 230 and the second insulative film 240 and connected at one end thereof to the runner electrode 130 and at the other end thereof to the third well region 150. The semiconductor film 250 is, for example, made of polysilicon. In a portion of the semiconductor film 250, the zener diode 120 is formed.

In other words, the zener diode 120 is formed on the first insulative film 230 and the second insulative film 240. The zener diode 120 is divided into the first portion 310 and the second portion 320. The first portion 310 is disposed on the first insulative film 230 and connected to the first surface of the substrate 200. The first portion 310 is connected via the electrode unit 152 to the third well region 150, which is positioned on the first surface side of the substrate 200 and electrically connected to the second terminal 116. In other words, the first portion 310 of the zener diode 120 is connected to the first surface of the substrate 200 at the peripheral portion of the device 300 and extends toward the central portion of the device 300.

The first portion 310 is positioned more distant from the first well region 132, to which the first terminal 114 is connected, than the second portion 320 of the zener diode 120 is. Stated differently, in the +X direction extending from the runner electrode 130 to the third well region 150 in FIG. 5, the second portion 320 and the first portion 310 of the zener diode 120 are arranged in the stated order.

The second portion 320 of the zener diode 120 is positioned on the second insulative film 240 and connected to the gate terminal 112 via the runner electrode 130. The second portion 320 is shorter than the first portion 310 in the direction in which the zener diode 120 extends (i.e., the X direction), for example. Accordingly, the second portion 320 has a lower breakdown voltage than the first portion 310.

In the present embodiment, however, the breakdown voltage of the second portion 320 is configured higher than the difference between the DC voltage applied to the second terminal 116 while the vertical semiconductor switch 110 is turned off and the threshold voltage Vth of the vertical semiconductor switch 110. Here, the DC voltage applied to the second terminal 116 while the vertical semiconductor switch 110 is turned off is, for example, the constant voltage Vb, which is fed by the power source 40 via the ignition coil 30. Thus, the breakdown voltage Vzd of the second portion 320 is higher than the result of Vb−Vth (for example, 14−2=12 V) (Vzd>Vb−Vth).

As described above, the device 300 relating to the present embodiment is configured such that a portion of the zener diode 120 (i.e., the second portion 320) is also formed on the second insulative film 240 and the portion has a breakdown voltage higher than a predetermined voltage value. In this way, in the device 300 relating to the present embodiment, the portion of the zener diode 120 (the second portion 320) remains connected to the gate terminal 112 even if a sharply rising high voltage (positive surge), which is positive relative to the collector potential, is applied between the first terminal 114 and the second terminal 116 and breakdown resultantly occurs in the vicinity of the boundary between the first insulative film 230 and the second insulative film 240.

The collector voltage (i.e., the constant voltage Vb) is fed to the runner electrode 130 via the second portion 320 of the zener diode 120. For this reason, as long as the control signal generator 10 feeds a voltage of substantially 0 V to the gate terminal 112, the DC gate voltage Vg of the vertical semiconductor switch 110 is represented as Vb−Vzd and Vg=Vb−Vzd<Vth. Accordingly, as long as the first terminal 114 of the vertical semiconductor switch 110 has a voltage of substantially 0 V, the electrical connection between the first terminal 114 and the second terminal 116 can be cut off.

According to the device 300 relating to the present embodiment described above, even if a positive surge applied between the first terminal 114 and the second terminal 116 causes breakdown in the vicinity of the boundary between the first insulative film 230 and the second insulative film 240, the vertical semiconductor switch 110 can be still turned off in response to the switching control signal from the control signal generator 10. As described above, the device 300 can prevent the igniting device 1000 from being heated even if the vertical semiconductor switch 110 breaks down. This can diminish the influence of the breakdown on the driving of the automobile having the igniting device 1000 installed therein.

According to the forgoing description of the device 300 relating to the present embodiment, a portion of the zener diode 120 (i.e., the second portion 320) is also formed on the second insulative film 240. In addition, the device 300 may be configured such that the step-like portion at the boundary between the first insulative film 230 and the second insulative film 240 has the same polarity. To be specific, the zener diode 120 is desirably configured such that, at the boundary portion between the first insulative film 230 and the second insulative film 240, the end portion of the first portion 310 and the end portion of the second portion 320 are formed by semiconductors of the same conductivity type. FIG. 5 shows an example in which the conductivity type of the boundary portion is the n type.

Figure 6:
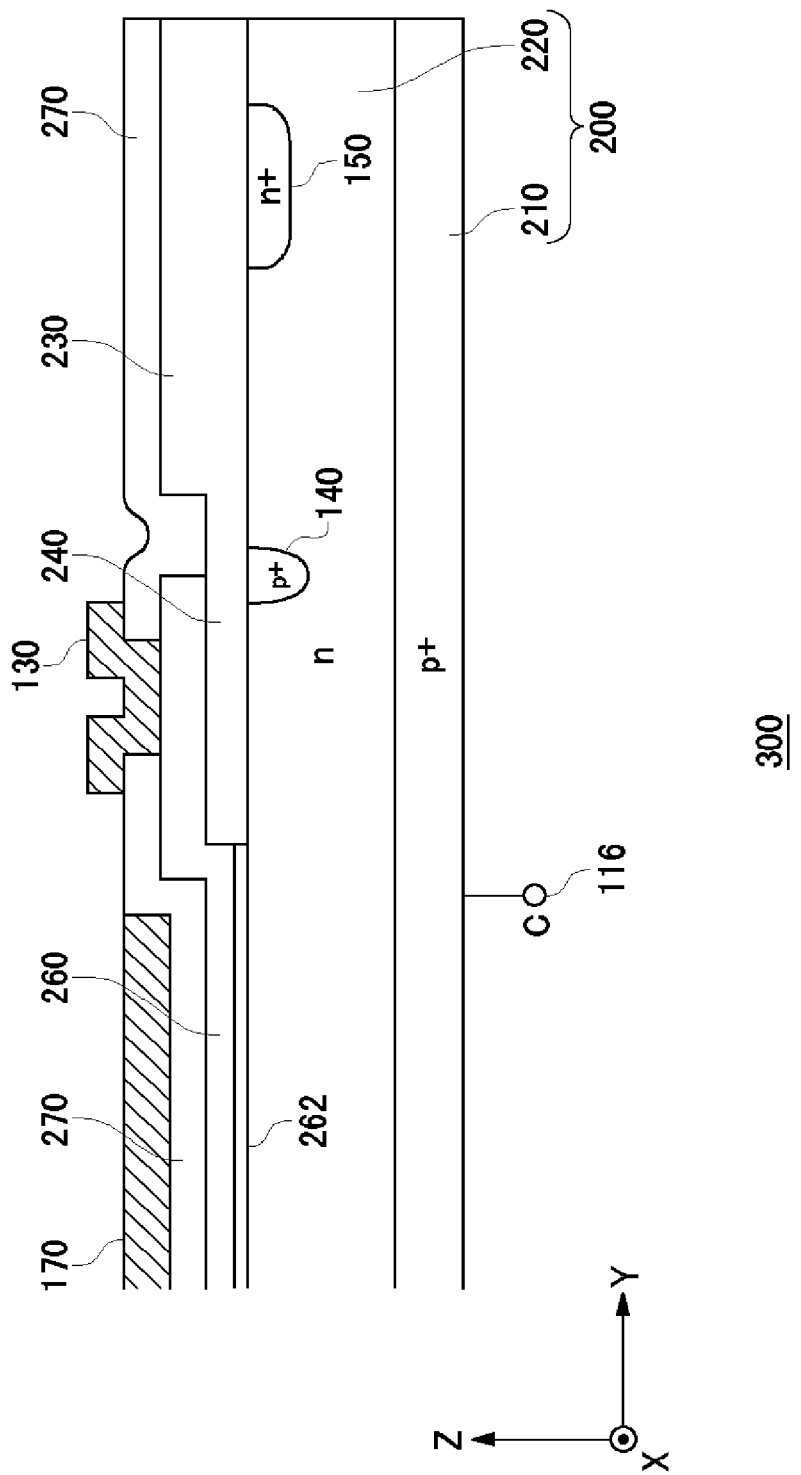
FIG. 6 shows a second example of the cross-section of the device 300 relating to the embodiment of the present invention.

FIG. 6 shows a second example of the cross-section of the device 300 relating to the embodiment of the present invention. FIG. 6 shows an exemplary cross-section of the device 300 shown in FIG. 4 along B-B'. FIG. 6 shows a cross-section of the device 300 along the plane substantially parallel to the YZ plane. The cross-sectional view shown in FIG. 6 shows the cross-section of the gate electrode 260 extending along the Y-axis direction.

The end portion of the gate electrode 260 in the Y direction covers a portion of the second insulative film 240.

The runner electrode 130 is formed on and in contact with the gate electrode 260. In this way, the runner electrode 130 electrically connects the gate electrode 260 and the gate terminal 112 to each other. Since the gate electrode 260 covers a portion of the second insulative film 240 as described above, the thickness of the second insulative film 240 is determined such that the step-like shape of the gate electrode 260 does not cause the gate electrode 260 to crack, chip or split. For example, the second insulative film 240 has a thickness of approximately several hundred nanometers.

On the other hand, the first insulative film 230 has such a thickness that the first insulative film 230 can have a sufficient breakdown voltage to withstand a surge or other inputs. The first insulative film 230 has, for example, a thickness of approximately several micrometers. As mentioned above, the first insulative film 230 and the second insulative film 240 have different thicknesses. According to the device 300 relating to the present embodiment, as described above, the zener diode 120 is formed in the semiconductor film 250, which is formed on the insulative films having different thicknesses, so as to extend over both of the insulative films having different thicknesses. In this way, the vertical semiconductor switch 110 can be still switched off even if breakdown occurs at the boundary between the different thicknesses. The following describes the flow of manufacturing the device 300 described above.

Figure 7:
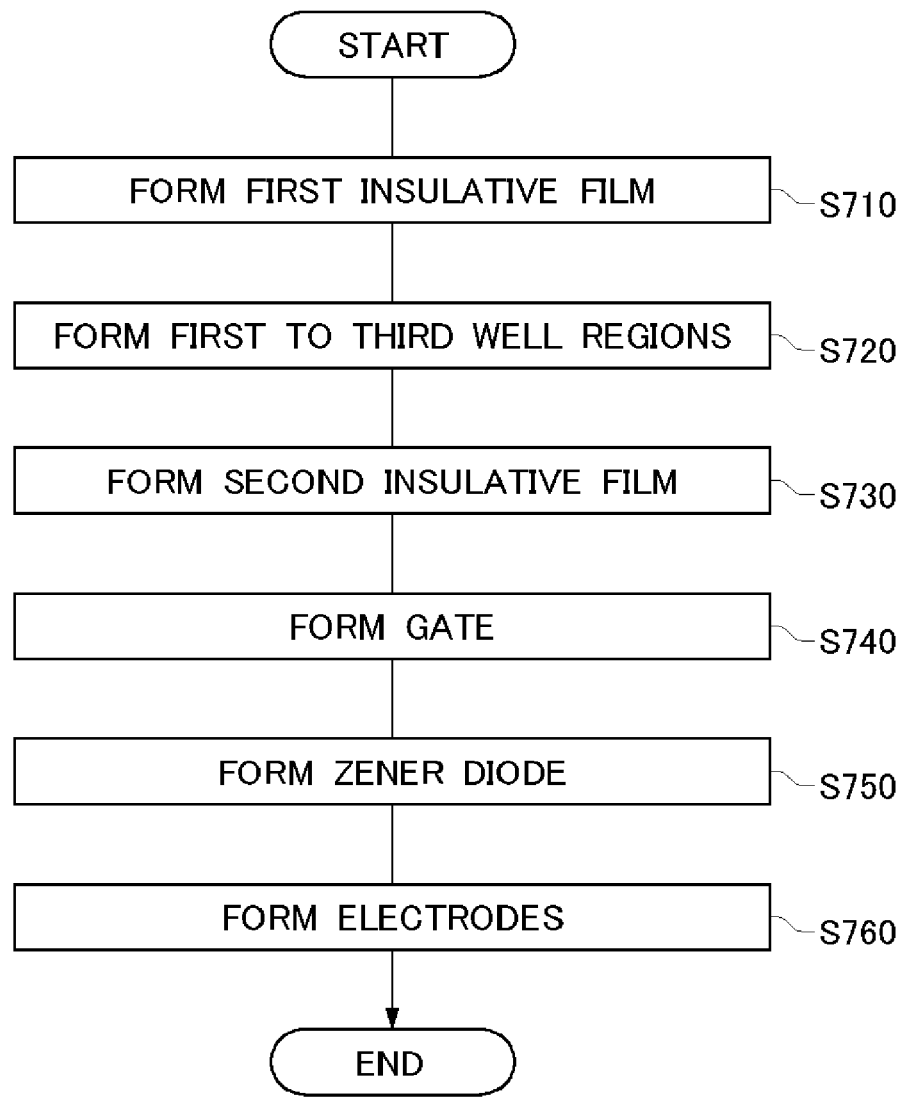
FIG. 7 shows an exemplary flow of manufacturing the device 300 relating to the embodiment of the present invention.
Figure 8:
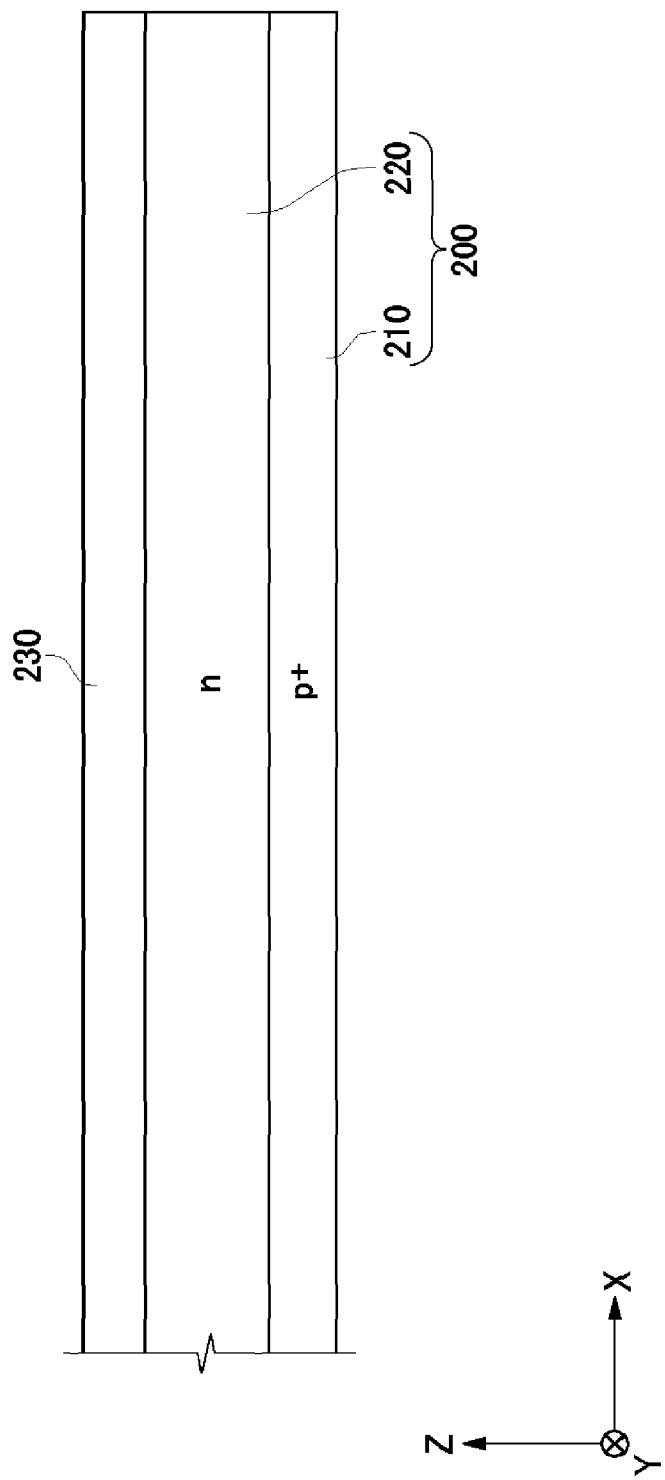
FIG. 8 is a cross-sectional view showing, as an example, a step for forming a first insulative film 230 on a first surface of a substrate 200 of the present embodiment.

FIG. 7 shows an exemplary flow of manufacturing the device 300 relating to the embodiment of the present invention. The device 300 is formed by performing the steps S710 to S760 shown in FIG. 7. To begin with, the first insulative film 230 is formed on the first surface of the substrate 200 (S710). For example, the substrate 200 is a p-type substrate and has the n-type layer region 220 and the p⁺-type layer region 210. The n-type layer region 220 is a portion of the p-type substrate including the first surface thereof and the p⁺-type layer region 210 is the remaining portion of the p-type substrate including the second surface. The first insulative film 230 is formed to cover the first surface of the n-type layer region 220. FIG. 8 is a cross-sectional view showing, as an example, a step for forming the first insulative film 230 on the first surface of the substrate 200 of the present embodiment.

Figure 9:
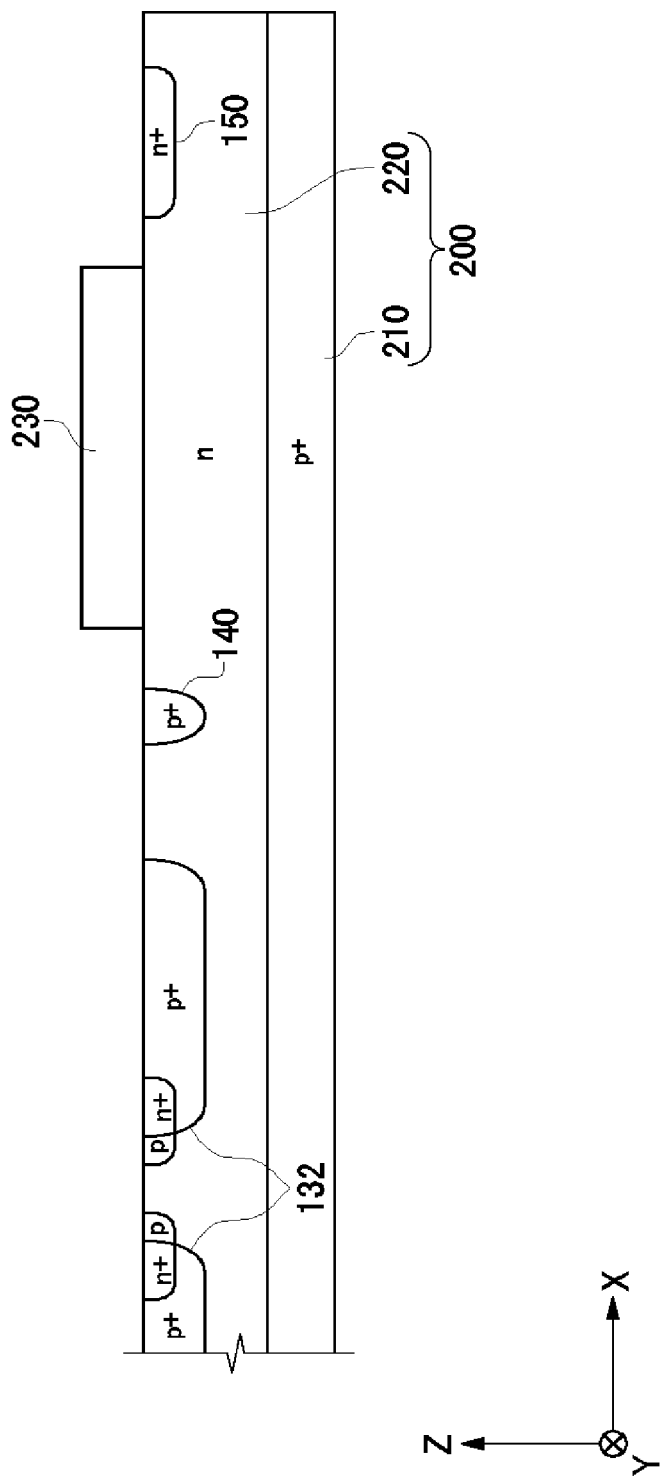
FIG. 9 is a cross-sectional view showing, as an example, a step for forming a first well region 132, a second well region 140, and a third well region 150 in the substrate 200 of the present embodiment on the first surface side thereof.

Subsequently, a portion of the first insulative film 230 is removed to expose a portion of the n-type layer region 220, and the first well region 132, the second well region 140 and the third well region 150 are formed in the exposed portion of the n-type layer region 220 (S720). Here, the first well region 132 and the second well region 140 are, for example, formed by implanting substantially the same impurities. In this case, the first well region 132 and the second well region 140 are desirably formed by substantially the same processes. FIG. 9 is a cross-sectional view showing, as an example, a step for forming the first well region 132, the second well region 140, and the third well region 150 in the substrate 200 of the present embodiment on the first surface side thereof.

Figure 10:
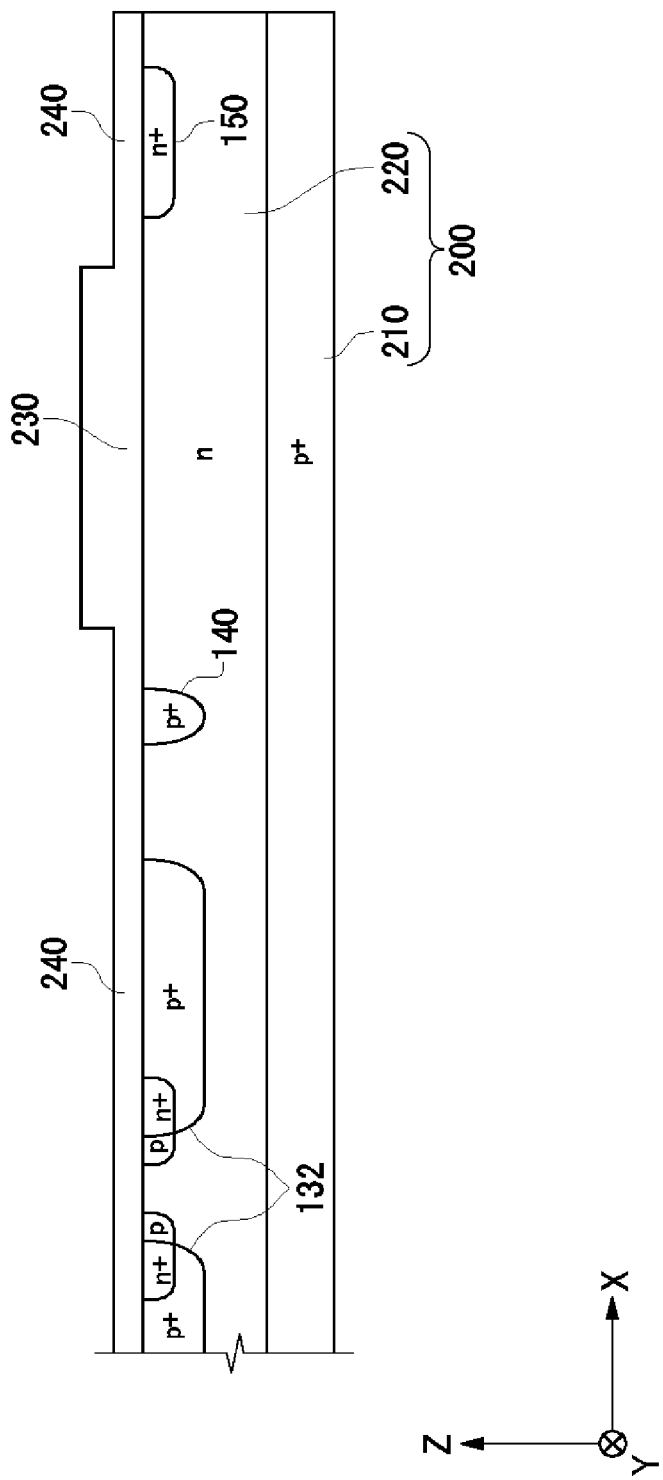
FIG. 10 is a cross-sectional view showing, as an example, a step for forming a second insulative film 240 on the first surface of the substrate 200 of the present embodiment.

Following this, the second insulative film 240 is formed on the first surface of the substrate 200. The second insulative film 240 is thinner than the first insulative film 230 and in contact with the first insulative film 230 (S730). The second insulative film 240 covers the first surface of the substrate 200. The second insulative film 240 is made of the same type of materials or substantially the same materials as the first insulative film 230, for example. In this case, the second insulative film 240 may be also formed on the first insulative film 230. When made of substantially the same materials, the first insulative film 230 and the second insulative film 240 are, for example, continuous on the first surface of the substrate 200. FIG. 10 is a cross-sectional view showing, as an example, a step for forming the second insulative film 240 on the first surface of the substrate 200 of the present embodiment.

Figure 11:
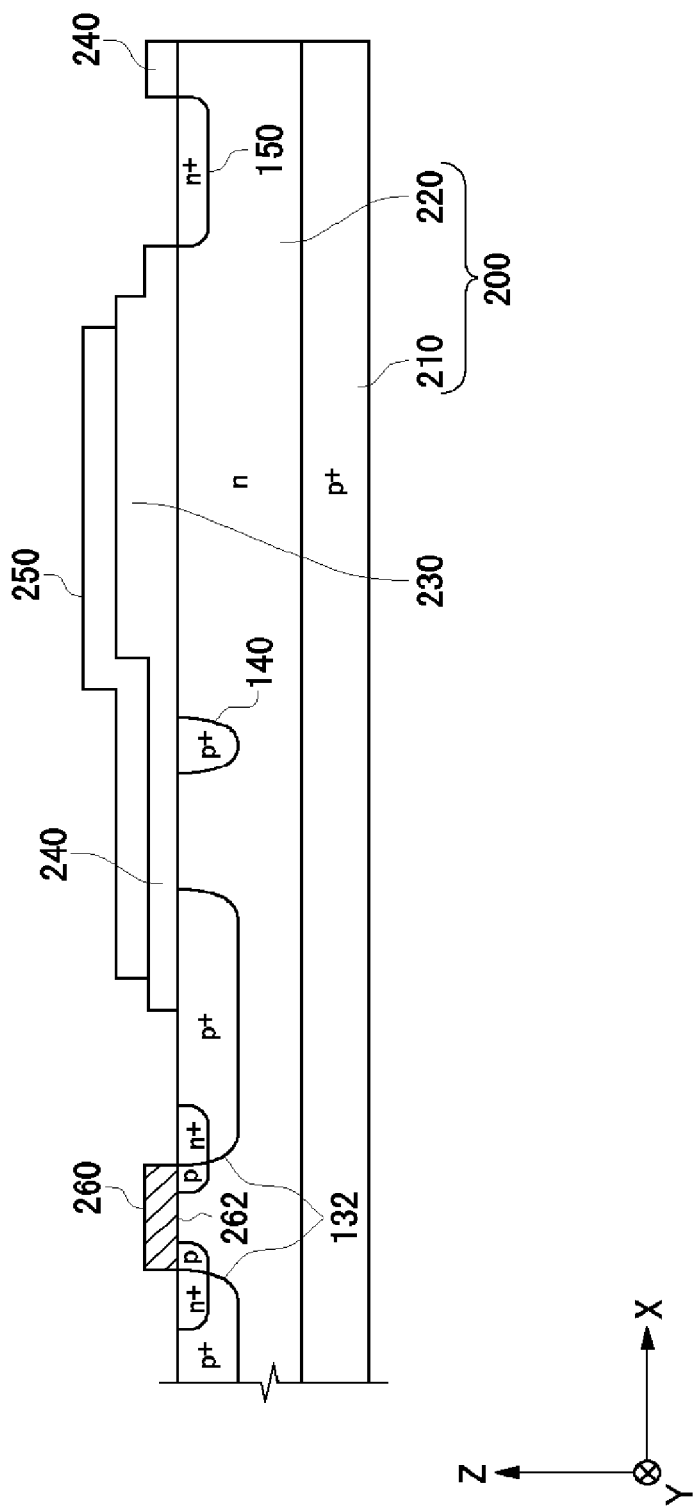
FIG. 11 is a cross-sectional view showing, as an example, a step for forming a gate insulator 262, a gate electrode 260, and a semiconductor film 250 on the first surface of the substrate 200 of the present embodiment.

Subsequently, a portion of the second insulative film 240 is removed to expose a portion of the n-type layer region 220, and the gate insulator 262 and the gate electrode 260 are formed on the exposed portion of the n-type layer region 220 (S740). In the above-described manner, the basic structure is completed for the vertical semiconductor switch 110. To be specific, the above-described process provides the vertical semiconductor switch 110 that is designed to establish or cut off the electrical connection between the first terminal 114 on the first surface side of the substrate 200 and the second terminal 116 on the second surface side of the substrate 200. In addition, the semiconductor film 250 is formed on the first insulative film 230 and the second insulative film 240. FIG. 11 is a cross-sectional view showing, as an example, a step for forming the gate insulator 262, the gate electrode 260, and the semiconductor film 250 on the first surface of the substrate 200 of the present embodiment.

Figure 12:
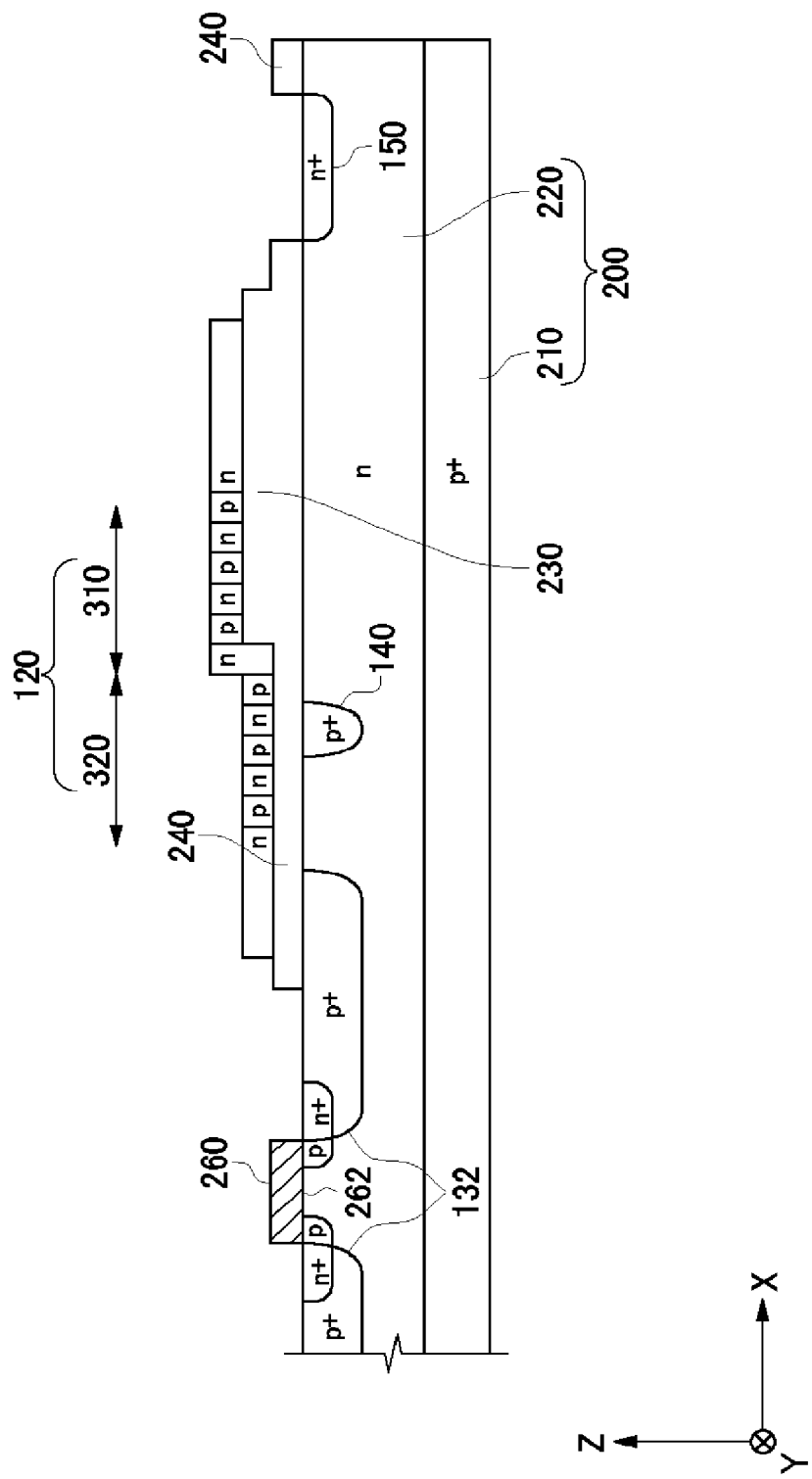
FIG. 12 is a cross-sectional view showing, as an example, a step for forming a zener diode 120 in a semiconductor film 250 of the present embodiment.

After this, the zener diode 120 is formed on the first insulative film 230 and the second insulative film 240 (S750). To be more specific, the first portion 310 is formed on the first insulative film 230 and connected to the first surface of the substrate 200, and the second portion 320 is formed on the second insulative film 240 and connected to the gate terminal 112. The zener diode 120 is formed, for example, by alternately implanting a p-type material and an n-type material into the semiconductor film 250 in the X-direction. FIG. 12 is a cross-sectional view showing, as an example, a step for forming the zener diode 120 in the semiconductor film 250 of the present embodiment.

Following this, the third insulative film 270 is formed to cover the resultant first surface of the substrate 200. A portion of the third insulative film 270 is removed. The to-be-removed portion is formed on the first surface of the substrate 200 in a portion of the region in which electrodes are to be formed. In other words, a contact hole is formed to expose the material positioned under the third insulative film 270.

Subsequently, electrodes are formed in the region including the contact hole (S760). The electrodes include, for example, the runner electrode 130, the electrode unit 152 and the emitter electrode 170. In addition, the collector electrode may be also formed on the second surface of the substrate 200. In addition, the gate terminal 112, the first terminal 114 and the second terminal 116 may be also formed.

Figure 13:
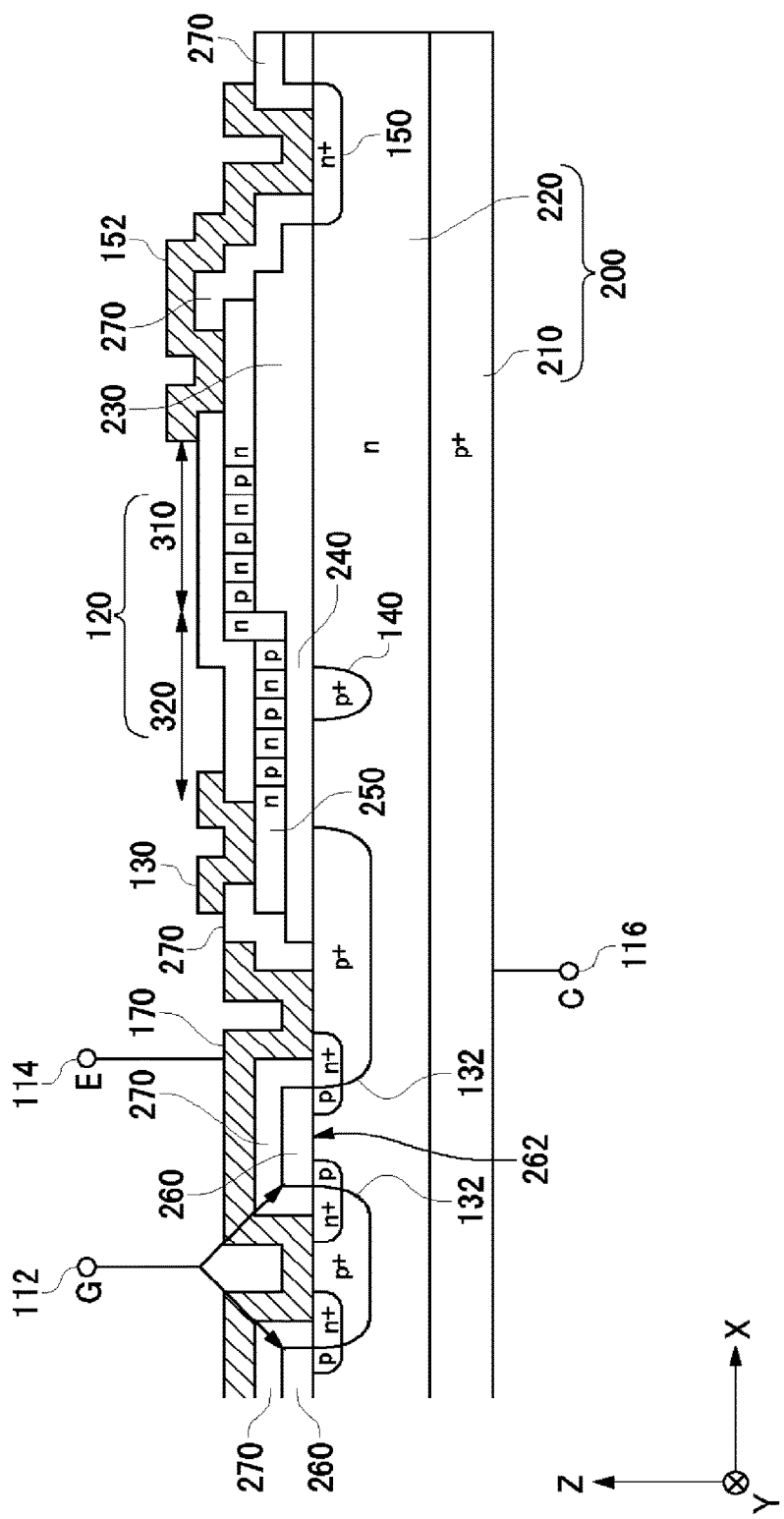
FIG. 13 is a cross-sectional view showing, as an example, a step for forming a device 300 relating to the present embodiment.

The above-described manufacturing flow completes the device 300 relating to the present embodiment. FIG. 13 is a cross-sectional view showing, as an example, a step for forming the device 300 relating to the present embodiment. After the electrodes are formed, a protective film may be formed. If such is the case, the protective film is an insulative film containing silicon, for example.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A device comprising:
a vertical semiconductor switch including (i) a gate terminal and a first terminal provided on a first surface of a substrate and (ii) a second terminal provided on a second surface of the substrate, the vertical semiconductor switch being configured to electrically connect or disconnect the first terminal and the second terminal;
a first insulative film provided on the first surface of the substrate;
a second insulative film provided on the first surface of the substrate, the second insulative film being in contact with the first insulative film and being entirely thinner than the first insulative film; and
a zener diode formed on the first insulative film and the second insulative film, the zener diode including a first portion that is formed on the first insulative film and connected to the first surface of the substrate and a second portion that is formed on the second insulative film and connected to the gate terminal,
wherein the first portion includes alternating p-type regions and n-type regions directly on the first insulative film and the second portion includes alternating p-type regions and n-type regions directly on the second insulative film, and
the first portion of the zener diode is positioned more distant from a first well region to which the first terminal is connected than the second portion of the zener diode is.

2. The device of claim 1, wherein
a breakdown voltage of the second portion of the zener diode is higher than a difference between a voltage applied to the second terminal to turn off the vertical semiconductor switch and a threshold voltage of the vertical semiconductor switch.

3. The device of claim 1, wherein
at a boundary portion between the first insulative film and the second insulative film, an end portion of the first portion of the zener diode and an end portion of the second portion of the zener diode are made of semiconductors of a same conductivity type.

4. The device of claim 1, comprising
a second well region that is formed in the substrate on the first surface side thereof and positioned directly under the second insulative film, the second well region having a same conductivity type as a first well region to which the first terminal is connected, the second well region being insulated from the first well region.

5. The device of claim 1, wherein
the first portion of the zener diode is connected to the first surface of the substrate at a peripheral portion of the device and extends toward a central portion of the device.

6. The device of claim 1, wherein
the first portion of the zener diode is connected to a third well region, and the third well region is formed in the substrate on the first surface side thereof and electrically connected to the second terminal.

7. The device of claim 1, wherein the vertical semiconductor switch is an insulated gate bipolar transistor (IGBT).

8. A device comprising:
a vertical semiconductor switch including (i) a gate terminal and a first terminal provided on a first surface of a substrate and (ii) a second terminal provided on a second surface of the substrate, the vertical semiconductor switch being configured to electrically connect or disconnect the first terminal and the second terminal;
a first insulative film provided on the first surface of the substrate;
a second insulative film provided on the first surface of the substrate, the second insulative film being in contact with the first insulative film and being entirely thinner than the first insulative film; and
a zener diode formed on the first insulative film and the second insulative film, the zener diode including a first portion that is formed on the first insulative film and connected to the first surface of the substrate and a second portion that is formed on the second insulative film and connected to the gate terminal,
wherein the first portion includes alternating p-type regions and n-type regions directly on the first insulative film and the second portion includes alternating p-type regions and n-type regions directly on the second insulative film, and
the second portion of the zener diode is shorter than the first portion of the zener diode.

9. A device manufacturing method comprising:
forming a first insulative film on a first surface of a substrate;
forming a second insulative film on the first surface of the substrate, the second insulative film being entirely thinner than the first insulative film and in contact with the first insulative film;
forming a vertical semiconductor switch including a first terminal provided on the first surface of the substrate and a second terminal provided on a second surface of the substrate, the vertical semiconductor switch being configured to electrically connect or disconnect the first terminal and the second terminal;
forming a zener diode on the first insulative film and the second insulative film, the zener diode including a first portion provided on the first insulative film and connected to the first surface of the substrate and a second portion provided on the second insulative film and connected to a gate terminal of the vertical semiconductor switch, the first portion of the zener diode positioned more distant from a first well region to which the first terminal is connected than the second portion of the zener diode is,
wherein forming the zener diode includes alternately implanting a p-type material and an n-type material into the first portion directly on the first insulative film and alternately implanting a p-type material and an n-type material into the second portion directly on the second insulative film.

* * * * *